(12) United States Patent
Xu

(10) Patent No.: US 11,013,115 B2
(45) Date of Patent: May 18, 2021

(54) DISPLAY PANEL MOTHERBOARD AND MANUFACTURING METHOD FOR DISPLAY PANEL

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventor: Yuanjie Xu, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 325 days.

(21) Appl. No.: 15/735,727

(22) PCT Filed: Jun. 27, 2017

(86) PCT No.: PCT/CN2017/090328
§ 371 (c)(1),
(2) Date: Dec. 12, 2017

(87) PCT Pub. No.: WO2018/107716
PCT Pub. Date: Jun. 21, 2018

(65) Prior Publication Data
US 2020/0045818 A1 Feb. 6, 2020

(30) Foreign Application Priority Data
Dec. 16, 2016 (CN) .......................... 201611170309.0

(51) Int. Cl.
*G02F 1/1333* (2006.01)
*H05K 1/11* (2006.01)
*H01L 51/00* (2006.01)

(52) U.S. Cl.
CPC ....... *H05K 1/118* (2013.01); *G02F 1/133305* (2013.01); *H01L 51/0097* (2013.01)

(58) Field of Classification Search
CPC .............. H05K 1/118; G02F 1/133305; H01L 51/0097; C03C 17/38; C03C 17/366;
(Continued)

(56) References Cited

U.S. PATENT DOCUMENTS

2006/0152137 A1* 7/2006 Beteille ............. B32B 17/10541
313/503
2006/0290595 A1* 12/2006 Takeuchi ............. G09G 3/3233
345/55

(Continued)

FOREIGN PATENT DOCUMENTS

CN 203277504 U 11/2013
CN 103540269 A 1/2014

(Continued)

OTHER PUBLICATIONS

International Search Report dated Sep. 20, 2017 issued in corresponding International Application No. PCT/CN2017/090328.

(Continued)

*Primary Examiner* — Steven T Sawyer
(74) *Attorney, Agent, or Firm* — Nath, Goldberg & Meyer; Joshua B. Goldberg

(57) ABSTRACT

The present invention discloses a display panel motherboard and a manufacturing method of a display panel. The display panel motherboard includes a rigid substrate; a flexible substrate; and a liquid-philicity adjustable layer provided between the rigid substrate and the flexible substrate, wherein the liquid-philicity adjustable layer bonds the flexible substrate to the rigid substrate.

13 Claims, 2 Drawing Sheets

(58) Field of Classification Search
CPC ... C03C 17/002; C03C 2218/116; C09D 7/48; C09D 5/004; C09D 7/67; C08K 3/08
See application file for complete search history.

(56) References Cited

U.S. PATENT DOCUMENTS

| | | | |
|---|---|---|---|
| 2007/0188442 A1* | 8/2007 | Hattori | G02F 1/167 345/107 |
| 2011/0261443 A1* | 10/2011 | Isojima | C03C 17/002 359/360 |
| 2013/0273297 A1 | 10/2013 | Zafiroglu | |
| 2014/0092464 A1* | 4/2014 | Arsenault | G01N 21/7743 359/290 |
| 2014/0262002 A1* | 9/2014 | Suwa | C09J 5/06 156/249 |
| 2015/0144613 A1* | 5/2015 | Guillemot | H05B 3/74 219/460.1 |
| 2016/0056297 A1* | 2/2016 | Yu | H01L 21/321 257/43 |
| 2016/0088756 A1* | 3/2016 | Ramadas | B32B 27/20 361/728 |
| 2017/0053824 A1* | 2/2017 | Wang | H01L 21/02164 |
| 2017/0162825 A1 | 6/2017 | Xiao et al. | |

FOREIGN PATENT DOCUMENTS

| | | |
|---|---|---|
| CN | 105024018 A | 11/2015 |
| CN | 105098088 A | 11/2015 |
| CN | 105374829 A | 3/2016 |
| CN | 105552247 A | 5/2016 |
| CN | 106448473 A | 2/2017 |
| JP | H9-281331 A | 10/1997 |

OTHER PUBLICATIONS

Office Action dated Jul. 4, 2017 issued in corresponding Chinese Application No. 201611170309.0.
Search Report dated May 22, 2017 issued in corresponding Chinese Application No. 201611170309.0.

* cited by examiner

DISPLAY PANEL MOTHERBOARD AND MANUFACTURING METHOD FOR DISPLAY PANEL

This is a National Phase Application filed under 35 U.S.C. 371 as a national stage of PCT/CN2017/090328, filed Jun. 27, 2017, an application claiming the benefit of Chinese Application No. 201611170309.0, filed Dec. 16, 2016, the content of each of which is hereby incorporated by reference in its entirety.

TECHNICAL FIELD

The present invention relates to the field of display technology, in particular to a display panel motherboard and a manufacturing method for a display panel.

BACKGROUND

Generally, a flexible display device is formed by a very thin flexible substrate. Compared with traditional displays, flexible display devices have advantages of ultra-thinness, light weight, good durability, large storage capacity, free design, being rollable, and the like, and have been widely used in display products, especially in mobile communication devices. At present, research on flexible display devices is mainly on flexible organic light emitting diodes (FOLEDs), flexible electronic ink displays (also referred to as flexible electrophoretic displays, FEPDs in short), and flexible liquid crystal displays (FLCDs).

Substrates of display panels of the above various flexible display devices are flexible substrates. A manufacturing process for a flexible display panel mainly includes: bonding a flexible substrate to a rigid substrate; forming a display element on the flexible substrate; and peeling off the flexible substrate from the rigid substrate to obtain a flexible display panel.

SUMMARY

In the process of peeling off the flexible substrate from the rigid substrate, improper operation may cause the flexible substrate and the display element to be deformed and damaged, and in addition, problems such as excessive separation residues and the like may occur, thereby adversely affecting performance of the display element, and resulting in decreased yield.

Therefore, it is an urgent technical problem to be solved in the art to provide a motherboard of a flexible display panel in which a flexible substrate can be effectively peeled off from a rigid substrate.

The present invention is intended to solve at least one of the technical problems existing in the prior art and provides a display panel motherboard and a manufacturing method for a display panel.

According to an aspect of the present invention, there is provided a display panel motherboard, including: a rigid substrate; a flexible substrate; and a liquid-philicity adjustable layer provided between the rigid substrate and the flexible substrate. The liquid-philicity adjustable layer bonds the flexible substrate to the rigid substrate.

According to an embodiment of the present invention, the liquid-philicity adjustable layer may include one or more adjustable layer units. Each of the adjustable layer units may include a first liquid-philicity adjustable layer, a light-and-heat barrier layer, and a second liquid-philicity adjustable layer. The light-and-heat barrier layer is between the first liquid-philicity adjustable layer and the second liquid-philicity adjustable layer.

According to an embodiment of the present invention, the liquid-philicity, adjustable layer may include one adjustable layer unit. The first liquid-philicity adjustable layer of the adjustable layer unit is between the light-and-heat barrier layer and the flexible substrate, and the second liquid-philicity adjustable layer is between the light-and-heat barrier layer and the rigid substrate.

According to an embodiment of the present invention, the liquid-philicity adjustable layer may include a plurality of adjustable layer units which are stacked. The first liquid-philicity adjustable layer of the adjustable layer unit in contact with the flexible substrate is in contact with the flexible substrate, and the second liquid-philicity adjustable layer of the adjustable layer unit in contact with the rigid substrate is in contact with the rigid substrate.

According to an embodiment of the present invention, the display panel motherboard may further include a display element on a side of the flexible substrate away from the liquid-philicity adjustable layer.

According to another aspect of the present invention, there is provided a manufacturing method for manufacturing a display panel, including: preparing a rigid substrate and a flexible substrate; performing hydrophilic treatment on surfaces of the rigid substrate and the flexible substrate that are to be arranged to face each other; providing a liquid-philicity adjustable layer on the surface, subjected to the hydrophilic treatment, of at least one of the rigid substrate and the flexible substrate; controlling the liquid-philicity adjustable layer to have a first liquid-philicity so that hydrophilic groups are formed at a surface of the liquid-philicity adjustable layer, and bonding the flexible substrate to the rigid substrate; forming a display element on a surface of the flexible substrate away from the rigid substrate; and controlling the liquid-philicity adjustable layer to have a second liquid-philicity so that hydrophobic groups are formed at the surface of the liquid-philicity adjustable layer and peeling off the flexible substrate from the rigid substrate.

According to an embodiment of the present invention, the step of controlling the liquid-philicity adjustable layer to have the first liquid-philicity may include causing the liquid-philicity adjustable layer to be at a first temperature so that the hydrophilic groups are formed at the surface of the liquid-philicity adjustable layer, and the step of controlling the liquid-philicity adjustable layer to have the second liquid-philicity may include causing the liquid-philicity adjustable layer to be at a second temperature so that the hydrophobic groups are formed at the surface of the liquid-philicity adjustable layer.

According to an embodiment of the present invention, the step of controlling the liquid-philicity adjustable layer to have the first liquid-philicity may include causing the liquid-philicity adjustable layer to be at a first pH value so that the hydrophilic groups are formed at the surface of the liquid-philicity adjustable layer, and the step of controlling the liquid-philicity adjustable layer to have the second liquid-philicity may include causing the liquid-philicity adjustable layer to at a second pH value so that the hydrophobic groups are formed at the surface of the liquid-philicity adjustable layer.

According to an embodiment of the present invention, the step of controlling the liquid-philicity adjustable layer to have the first liquid-philicity may include applying a voltage having a first electric field intensity to the liquid-philicity adjustable layer so that the hydrophilic groups are formed at the surface of the liquid-philicity adjustable layer, and the step of controlling the liquid-philicity adjustable layer to have the second liquid-philicity may include applying a voltage having a second electric field intensity to the liquid-philicity adjustable layer so that the hydrophobic groups are formed at the surface of the liquid-philicity adjustable layer.

According to an embodiment of the present invention, the step of controlling the liquid-philicity adjustable layer to have the first liquid-philicity may include irradiating the liquid-philicity adjustable layer with light having a first intensity so that the hydrophilic groups are formed at the surface of the liquid-philicity adjustable layer, and the step of controlling the liquid-philicity adjustable layer to have the second liquid-philicity may include irradiating the liquid-philicity adjustable layer with light having a second intensity so that the hydrophobic groups are formed at the surface of the liquid-philicity adjustable layer.

According to an embodiment of the present invention, the step of controlling the liquid-philicity adjustable layer to have the first liquid-philicity may include placing the liquid-philicity adjustable layer in a first reaction liquid so that the hydrophilic groups are formed at the surface of the liquid-philicity adjustable layer, and the step of controlling the liquid-philicity adjustable layer to have the second liquid-philicity may include placing the liquid-philicity adjustable layer in a second reaction liquid so that the hydrophobic groups are formed at the surface of the liquid-philicity adjustable layer.

According to the display panel motherboard and the manufacturing method for the display panel of the present invention, when a display element needs to be formed on a surface of the flexible substrate, the liquid-philicity of the liquid-philicity adjustable layer can be changed to form hydrophilic groups so that the flexible substrate and the rigid substrate can be firmly bonded together through the liquid-philicity adjustable layer having the first liquid-philicity so as to effectively prevent film layers of the display element from falling off or sliding. When the flexible substrate needs to be peeled off from the rigid substrate, the liquid-philicity of the liquid-philicity adjustable layer can be changed to form hydrophobic groups so that the liquid-philicity adjustable layer having the second liquid-philicity has poor adhesion or no adhesion, which facilities peeling off the flexible substrate from the rigid substrate, thereby improving peeling yield and effectively ensuring performance of the display panel.

BRIEF DESCRIPTION OF THE DRAWINGS

The accompanying drawings, which are used for providing a further understanding of the present invention and constitute a part of the specification, are used for explaining the inventive concept together with the following specific implementations, rather than limiting the present invention. In the drawings.

DETAILED DESCRIPTION

Specific implementations of the present invention will be described in detail below with reference to the accompanying drawings. It should be understood that, the specific implementations described herein are merely used for describing and explaining the present invention, rather than limiting the present invention.

Figure 1:
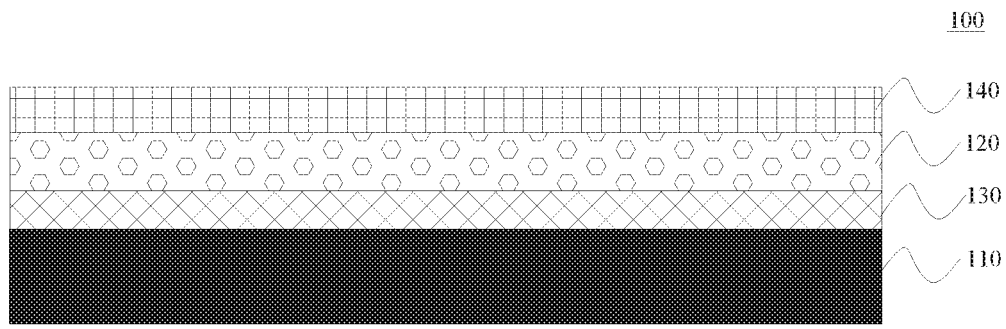
FIG. 1 is a schematic structural diagram of a display panel motherboard according to an embodiment of the present invention.
Figure 2:
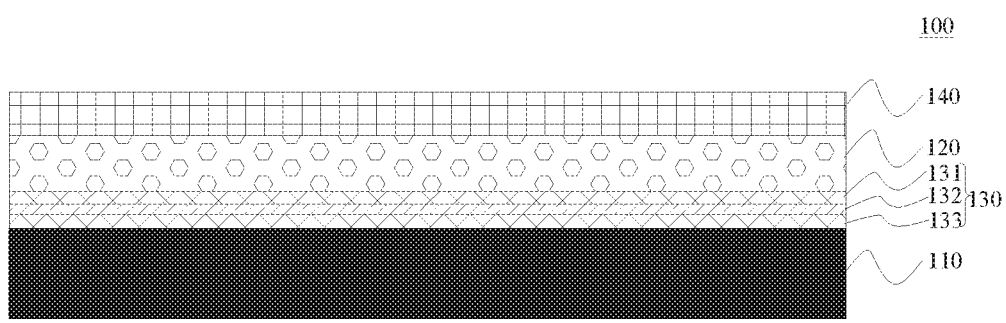
FIG. 2 is a schematic structural diagram of a display panel motherboard according to another embodiment of the present invention.

FIG. 1 is a schematic structural diagram of a display panel motherboard according to an embodiment of the present invention. FIG. 2 is a schematic diagram further illustrating a structure of a liquid-philicity adjustable layer in the display panel motherboard shown in FIG. 1.

Referring to FIG. 1, the display panel motherboard 100 according to an embodiment of the present invention includes a rigid substrate 110, a flexible substrate 120, and a liquid-philicity adjustable layer 130 provided between the rigid substrate 110 and the flexible substrate 120. The liquid-philicity adjustable layer 130 is used for bonding the flexible substrate 120 onto the rigid substrate 110.

It should be noted that, the rigid substrate 110 is not particularly limited in the present invention. For example, the rigid substrate 110 may be, for example, a hard glass substrate, or other substrate made of a material having a certain strength to bear the flexible substrate 120 located thereon.

In addition, it should be noted that the term "display panel motherboard" in the present invention refers to a motherboard having a size conforming to a size of a display panel after being manufactured and including a rigid substrate and a flexible substrate. Therefore, a display panel can be formed only by peeling off the flexible substrate on which the display element is formed from the rigid substrate, without a cutting process for cutting a large-sized substrate into a plurality of small-sized display panels.

Figure 3:
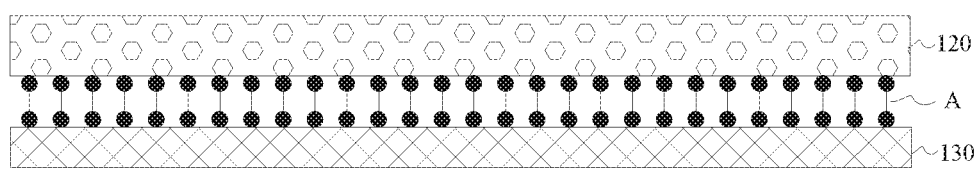
FIG. 3 schematically illustrates a liquid-philicity adjustable layer having hydrophilic groups being bonded to a flexible substrate in a display panel motherboard according to an embodiment of the present invention.
Figure 4:
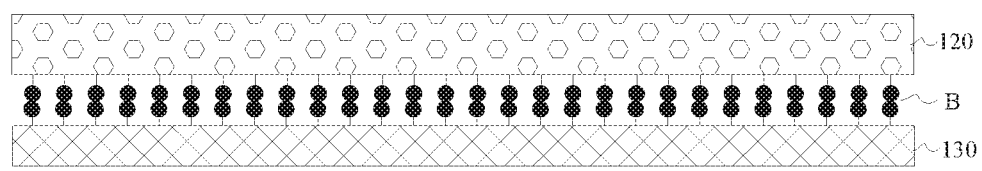
FIG. 4 schematically illustrates a liquid-philicity adjustable layer having hydrophobic groups being peeled off from a flexible substrate in a display panel motherboard according to an embodiment of the present invention.

FIG. 3 schematically illustrates a liquid-philicity adjustable layer having hydrophilic groups being bonded to a flexible substrate in a display panel motherboard according to an embodiment of the present invention. FIG. 4 schematically illustrates a liquid-philicity adjustable layer having hydrophobic groups being peeled off from a flexible substrate in a display panel motherboard according to an embodiment of the present invention.

According to an embodiments of the present invention, when a display element 140 needs to be formed on a surface of the flexible substrate 120, liquid-philicity of the liquid-philicity adjustable layer 130 may be changed to form hydrophilic groups A (as shown in FIG. 3), so that the flexible substrate 120 and the rigid substrate 110 can be firmly bonded together to effectively prevent film layers of the display element from falling off or sliding. When the flexible substrate 120 needs to be peeled off from the rigid substrate 110, the liquid-philicity of the liquid-philicity adjustable layer 130 may be changed to form hydrophobic groups B (as shown in FIG. 4), so that the liquid-philicity adjustable layer 130 has poor adhesion or no adhesion, which facilities peeling off the flexible substrate 120 from the rigid substrate 110, thereby improving peeling yield and effectively ensuring performance of the display panel.

According to the embodiments of the present invention, the liquid-philicity adjustable layer 130 should be made of such a material that the hydrophilic groups A and the hydrophobic groups B can be respectively formed under different conditions. However, the material of the liquid-philicity adjustable layer is not particularly limited in the present application, and may include corresponding materials for different processing conditions. Methods for processing the liquid-philicity adjustable layer 130 include, but are not limited to, using different temperatures, pH values, electric field intensities, light intensities, reaction liquids, or the like, to process the liquid-philicity adjustable layer 130 to form the hydrophilic groups A and the hydrophobic groups B, respectively, and the material of the liquid-philicity adjustable layer 130 may include different materials corresponding to various processing methods.

An adsorption force between the hydrophilic group A formed at the liquid-philicity adjustable layer 130 and the hydroxyl group (—OH) is relatively strong, and therefore, according to an embodiment of the present invention, hydrophilic treatment is performed in advance on surfaces of the flexible substrate 120 and the rigid substrate 110 to form hydroxyl groups (—OH) on the surfaces of the flexible substrate 120 and the rigid substrate 110, so as to improve surface adhesion of the liquid-philicity adjustable layer 130 including the hydrophilic groups A to the flexible substrate 120 and the rigid substrate 110, so that the rigid substrate 110 and the flexible substrate 120 are firmly bonded together, which facilitates formation of the display element 140 on the flexible substrate 120 in a subsequent process.

According to an embodiment of the present invention, the material of the liquid-philicity adjustable layer 130 may include the dendritic bismuth coating described by the author of Chunping Su in 2014 Annual Meeting of Chinese Chemical Society, details thereof may refer to the literature "Photoinduced reversible wettability of a dendritic bismuth coating between superhydrophobicity and superhydrophilicity" by the author of Chunping Su, which describes synthesizing dendritic bismuth coating by a simple chemical plating process, and the entire disclosure of which is incorporated by reference in its entirety. After being surface-modified by stearic acid, the coating shows remarkable superhydrophobicity (i.e., forming hydrophobic groups B) and self-cleaning properites, has a static water contact angle up to 165 degrees and a sliding angle smaller than 5 degrees. In addition, the prepared superhydrophobic bismuth coating can be tuned from superhydrophobicity to superhydrophilicity (i.e., forming hydrophilic groups A) under irradiation with ultraviolet-visible light for 50 minutes. The hydrophilic surface subjected to the irradiation can recover its superhydrophobicity by being modified again by stearic acid, thereby achieving reversible conversion under light control between superhydrophobicity and supethydrophilicity.

According to an embodiment of the present invention, the material of the liquid-philicity adjustable layer 130 may further include poly(N-isopropylacrylamide) (e.g. pNIPA, pNIPAAm, pNIPAA or pNIPAm) thermal-sensitive polymer, which is formed from N-isopropylacrylamide, and can switch between the hydrophilic group A and the hydrophobic group B through heat treatment, application of an electric field or other treatment.

Therefore, before the display element 140 is formed on the flexible substrate 120, the liquid-philicity adjustable layer 130 is controlled to have the hydrophilic groups A having strong adsorption force (i.e., strong adhesion) to the hydroxyl groups (—OH) on both the rigid substrate 110 and the flexible substrate 120 to firmly bond the rigid substrate 110 and the flexible substrate 120 together. When it needs to separate the rigid substrate 110 from the flexible substrate 120, the liquid-philicity adjustable layer 130 is controlled to have the hydrophobic groups B having poor adhesion to facilitate peeling off the rigid substrate 110 from the flexible substrate 120, thereby effectively ensuring yield of display panels.

FIG. 2 is a schematic structural diagram of a display panel motherboard according to another embodiment of the present invention.

Referring to FIG. 2, according to the embodiment, the liquid-philicity adjustable layer 130 may include one adjustable layer unit. The adjustable layer unit may include a first liquid-philicity adjustable layer 131, a second liquid-philicity adjustable layer 133, and a light-and-heat barrier layer 132 between the first liquid-philicity adjustable layer 131 and the second liquid-philicity adjustable layer 133. The first liquid-philicity adjustable layer 131 is located between the light-and-heat barrier layer 132 and the flexible substrate 120 to contact the flexible substrate 120, and the second liquid-philicity adjustable layer 133 is located between the light-and-heat barrier layer 132 and the rigid substrate 110 to contact the rigid substrate 110.

According to an embodiment of the present invention, the light-and-heat barrier layer 132 provided between the first liquid-philicity adjustable layer 131 and the second liquid-philicity adjustable layer 133 may control the first liquid-philicity adjustable layer 131 in contact with the flexible substrate 120 and the second liquid-philicity adjustable layer 133 in contact with the rigid substrate 110, respectively. For example, the liquid-philicity of the second liquid-philicity adjustable layer 133 in contact with the rigid substrate 110 may be changed to always have the hydrophilic groups A and to thus have strong adsorption force. When the rigid substrate 110 needs to be peeled off from the flexible substrate 120, only the liquid-philicity of the first liquid-philicity adjustable layer 131 in contact with the flexible substrate 120 may be changed to have the hydrophilic groups B, and thus the separation of the flexible substrate 120 from only the liquid-philicity adjustable layer 131 is achieved, which further shortens process time and improves manufacturing efficiency. In addition, when the second liquid-philicity adjustable layer 133 needs to be replaced, it only needs to change the liquid-philicity of the second liquid-philicity adjustable layer 133 to have the hydrophobic groups B, so as to achieve separation from the rigid substrate 110, which facilitates replacement of a new second liquid-philicity adjustable layer 133.

When the liquid-philicity of the first liquid-philicity adjustable layer 131 needs to be changed, the first liquid-philicity adjustable layer 131 may be irradiated with light or heated to change the liquid-philicity of the first liquid-philicity adjustable layer 131 (e.g., so as to form the hydrophobic groups B). The light-and-heat barrier layer 132 can block light or heat from transferring to the second liquid-philicity adjustable layer 133 on the other side thereof, and thus the liquid-philicity of the second liquid-philicity adjustable layer 133 is not changed.

It should be noted that the specific structure of the light-and-heat barrier layer 132 is not limited in the present invention, as long as it can isolate light and heat. In addition, it should be understood that the light-and-heat barrier layer 132 should be adhesively connected with the first liquid-philicity adjustable layer 131 and the second liquid-philicity adjustable layer 133. According to an embodiment of the present invention, the first liquid-philicity adjustable layer 131, the second liquid-philicity adjustable layer 133 and the light-and-heat barrier layer 132 may be integrally formed such that the light-and-heat barrier layer 132 is embedded between the first liquid-philicity adjustable layer 131 and the second liquid-philicity adjustable layer 133.

According to an embodiment of the present invention, the liquid-philicity adjustable layer 130 may include a plurality of adjustable layer units (not shown in the drawings) which are stacked. In the adjustable layer unit in contact with the flexible substrate 120, the first liquid-philicity adjustable layer 131 thereof is in contact with the flexible substrate 120, and in the adjustable layer unit in contact with the rigid substrate 110, the liquid-philicity adjustable layer 133 thereof is in contact with the rigid substrate 110.

By providing the plurality of adjustable layer units, the number of uses of the liquid-philicity adjustable layer 130 can be increased. When an adjustable layer unit is damaged due to repeated use, an adjustable layer unit next to the damaged adjustable layer unit may be used, thereby shortening the manufacturing time and improving the production yield.

According to an embodiment of the present invention, the display panel motherboard 100 may further include a display element 140 provided on a side of the flexible substrate 120 away from the liquid-philicity adjustable layer 130.

When the display element 140 is formed on the flexible substrate 120, the flexible substrate 120 and the rigid substrate 110 are firmly bonded together by the liquid-philicity adjustable layer 130 having the hydrophilic groups A, so as to effectively ensure that each film layer can be positioned accurately in its designed position in the process (for example, a film coating process) of forming the display element 140, thereby ensuring the performance of the display element 140.

Figure 5:
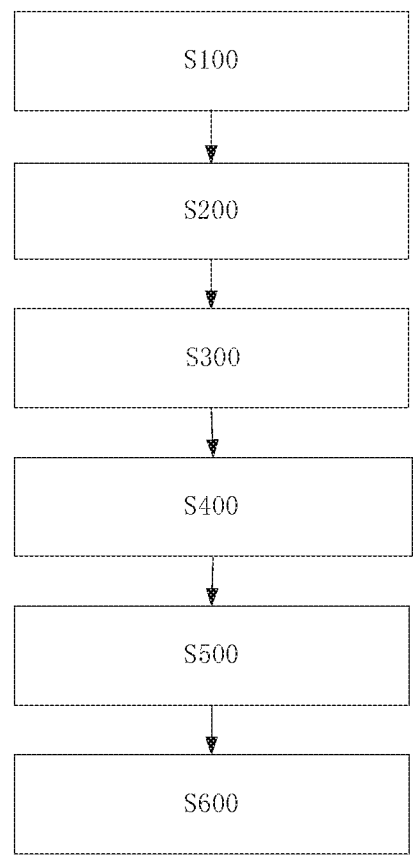
FIG. 5 is a flowchart of manufacturing a display panel according to an embodiment of the present invention.

FIG. 5 is a flowchart of manufacturing a display panel according to an embodiment of the present invention.

Referring to FIG. 5, the method for manufacturing a display panel according to an embodiment of the present invention includes:

S100: preparing a rigid substrate and a flexible substrate;

S200: performing hydrophilic treatment on a surface of the rigid substrate and a surface of the flexible substrate that are to be arranged to face each other;

S300: providing a liquid-philicity adjustable layer on the surface, that is subjected to the hydrophilic treatment, of at least one of the rigid substrate and the flexible substrate;

S400: controlling the liquid-philicity adjustable layer to have a first liquid-philicity such that hydrophilic groups are formed at a surface of the liquid-philicity adjustable layer, and the flexible substrate is bonded to the rigid substrate;

S500: forming a display element on a surface of the flexible substrate away from the rigid substrate; and S600: controlling the liquid-philicity adjustable layer to have a second liquid-philicity such that hydrophobic groups are formed at the surface of the liquid-philicity adjustable layer and the flexible substrate is peeled off from the rigid substrate.

According to an embodiment of the present invention, before the display element is formed on a surface of the flexible substrate, the liquid-philicity adjustable layer may be in a first preset condition such that the hydrophilic groups are formed at a surface of the liquid-philicity adjustable layer, and thus the flexible substrate and the rigid substrate can be bonded together firmly. When the flexible substrate needs to be peeled off from the rigid substrate, the liquid-philicity adjustable layer may be in a second preset condition such that the hydrophobic groups are formed at the surface of the liquid-philicity adjustable layer, which facilitates peeling off the flexible substrate from the rigid substrate, thus peeling yield can be effectively ensured, performance of the display element of the formed display panel can be improved, manufacturing time can be effectively saved and cost can be lowered.

According to embodiments of the present invention, the first preset condition and the second preset condition include, but are not limited to, processing conditions such as temperatures, PH values, electric field intensities, light intensities, reaction liquids, and the like.

According to an embodiment of the present invention, the step of controlling the liquid-philicity adjustable layer to have the first liquid-philicity may include causing the liquid-philicity adjustable layer to be at a first temperature so that the hydrophilic groups are formed at the surface of the liquid-philicity adjustable layer, and the step of controlling the liquid-philicity adjustable layer to have the second liquid-philicity may include causing the liquid-philicity adjustable layer to be at a second temperature so that the hydrophobic groups are formed at the surface of the liquid-philicity adjustable layer.

That is, in step S400, the liquid-philicity adjustable layer is caused to be at the first temperature so that the hydrophilic groups are formed at the surface of the liquid-philicity adjustable layer. In addition, in step S600, the liquid-philicity adjustable layer is caused to be at the second temperature so that the hydrophobic groups are formed at the surface of the liquid-philicity adjustable layer.

The temperature of the liquid-philicity adjustable layer can be changed in various ways, which are not listed one by one herein.

It should be noted that the first temperature and/or the second temperature may be a temperature range, a temperature threshold, a plurality of discrete temperature values, or a combination thereof.

According to an embodiment of the present invention, the step of controlling the liquid-philicity adjustable layer to have the first liquid-philicity may include causing the liquid-philicity adjustable layer to be at a first pH value so that the hydrophilic groups are formed at the surface of the liquid-philicity adjustable layer, and the step of controlling the liquid-philicity adjustable layer to have the second liquid-philicity may include causing the liquid-philicity adjustable layer to at a second pH value so that the hydrophobic groups are formed at the surface of the liquid-philicity adjustable layer.

That is, in step S400, the liquid-philicity adjustable layer is caused to be at the first PH value so that the hydrophilic groups are formed at the surface of the liquid-philicity adjustable layer. In addition, in step S600, the liquid-philicity adjustable layer is caused to be at the second PH value so that the hydrophobic groups are formed at the surface of the liquid-philicity adjustable layer.

According to an embodiment, for example, a holding tank (not shown in the drawings) may be used to accommodate solutions having different pH values, and the liquid-philicity adjustable layer may be placed in the holding tank to change the pH condition in which the liquid-philicity adjustable layer is positioned.

According to an embodiment of the present invention, the step of controlling the liquid-philicity adjustable layer to have the first liquid-philicity may include applying a voltage having a first electric field intensity to the liquid-philicity adjustable layer so that the hydrophilic groups are formed at the surface of the liquid-philicity adjustable layer, and controlling the liquid-philicity adjustable layer to have the second liquid-philicity may include applying a voltage having a second electric field intensity to the liquid-philicity adjustable layer so that the hydrophobic groups are formed at the surface of the liquid-philicity adjustable layer.

That is, in step S400, the liquid-philicity adjustable layer is applied with the voltage having the first electric field intensity so that the hydrophilic groups are formed at the surface of the liquid-philicity adjustable layer. In addition, in step S600, the liquid-philicity adjustable layer is applied with the voltage having the second electric field intensity value so that the hydrophobic groups are formed at the surface of the liquid-philicity adjustable layer.

According to the embodiment, for example, two electrodes arranged opposite to each other may be used to apply a voltage to the liquid-philicity adjustable layer. The liquid-philicity of the liquid-philicity adjustable layer is changed by changing the electric field intensity of the applied voltage, which is operationally simple.

According to an embodiment of the present invention, the step of controlling the liquid-philicity adjustable layer to have the first liquid-philicity may include irradiating the liquid-philicity adjustable layer with light having a first intensity so that the hydrophilic groups are formed at the surface of the liquid-philicity adjustable layer forms, and controlling the liquid-philicity adjustable layer to have the second liquid-philicity may include irradiating the liquid-philicity adjustable layer with light having a second intensity so that the hydrophobic groups are formed at the surface of the liquid-philicity adjustable layer.

That is, in step S400, the liquid-philicity adjustable layer is irradiated with the light having the first intensity so that the hydrophilic groups are formed at the surface of the liquid-philicity adjustable layer. In addition, in step S600, the liquid-philicity adjustable layer is irradiated with the light having the first intensity so that the hydrophobic groups are formed at the surface of the liquid-philicity adjustable layer.

According to the embodiment, for example, a light source (e.g., a UV light source) may be used to irradiate the liquid-philicity adjustable layer. The liquid-philicity of the liquid-philicity adjustable layer is changed by changing the intensity of irradiating light, which is operationally simple.

According to an embodiment of the present invention, the step of controlling the liquid-philicity adjustable layer to have the first liquid-philicity may include placing the liquid-philicity adjustable layer in a first reaction liquid so that the hydrophilic groups are formed at the surface of the liquid-philicity adjustable layer, and controlling the liquid-philicity adjustable layer to have the second liquid-philicity may include placing the liquid-philicity adjustable layer in a second reaction liquid so that the hydrophobic groups are formed at the surface of the liquid-philicity adjustable layer.

That is, in step S400, the liquid-philicity adjustable layer is placed in the first reaction liquid so that the hydrophilic groups are formed at the surface of the liquid-philicity adjustable layer. In addition, in step S600, the liquid-philicity adjustable layer is placed in the second reaction liquid so that the hydrophobic groups are formed at the surface of the liquid-philicity adjustable layer.

According to the embodiment, for example, the liquid-philicity adjustable layer may be placed in different reaction liquids to change the liquid-philicity of the liquid-philicity adjustable layer, which is operationally simple.

It could be understood that the above implementations are merely exemplary implementation adopted for describing the principle of the present invention, but the present invention is not limited thereto. Various variations and improvements may be made by those of ordinary skill in the art without departing from the spirit and essence of the present invention, and these variations and improvements shall also be considered as falling into the protection scope of the present invention.

What is claimed is:

1. A display panel motherboard, comprising:
a rigid substrate;
a flexible substrate; and
a liquid-philicity adjustable layer provided between the rigid substrate and the flexible substrate,
wherein the liquid-philicity adjustable layer bonds the flexible substrate to the rigid substrate, and the liquid-philicity adjustable layer is made of a material that hydrophilic groups and hydrophobic groups are respectively formed under different conditions, the flexible substrate and the rigid substrate are firmly bonded together, when a liquid-philicity of the liquid-philicity adjustable layer is changed to form hydrophilic groups under a first condition, and the flexible substrate is peeled off from the rigid substrate, when the liquid-philicity of the liquid-philicity adjustable layer is changed to form hydrophobic groups under a second condition,
wherein the liquid-philicity adjustable layer comprises one or more adjustable layer units each comprising:
a first liquid-philicity adjustable layer;
a light-and-heat barrier layer; and
a second liquid-philicity adjustable layer,
wherein the light-and-heat barrier layer is between the first liquid-philicity adjustable layer and the second liquid-philicity adjustable layer.

2. The display panel motherboard of claim 1, wherein the liquid-philicity adjustable layer comprises one adjustable layer unit, the first liquid-philicity adjustable layer of the adjustable layer unit is between the light-and-heat barrier layer and the flexible substrate, and the second liquid-philicity adjustable layer of the adjustable layer unit is between the light-and-heat barrier layer and the rigid substrate.

3. The display panel motherboard of claim 1, wherein the liquid-philicity adjustable layer comprises a plurality of adjustable layer units which are stacked, the first liquid-philicity adjustable layer of the adjustable layer unit in contact with the flexible substrate is in contact with the flexible substrate, and the second liquid-philicity adjustable layer of the adjustable layer unit in contact with the rigid substrate is in contact with the rigid substrate.

4. The display panel motherboard of claim 1, further comprising a display element on a side of the flexible substrate away from the liquid-philicity adjustable layer.

5. The display panel motherboard of claim 1, further comprising a display element on a side of the flexible substrate away from the liquid-philicity adjustable layer.

6. The display panel motherboard of claim 2, further comprising a display element on a side of the flexible substrate away from the liquid-philicity adjustable layer.

7. The display panel motherboard of claim 3, further comprising a display element on a side of the flexible substrate away from the liquid-philicity adjustable layer.

8. A manufacturing method for a display panel, comprising:
preparing a rigid substrate and a flexible substrate;
performing hydrophilic treatment on a surface of the rigid substrate and a surface of the flexible substrate that are to be arranged to face each other;

providing a liquid-philicity adjustable layer on the surface, which is subjected to the hydrophilic treatment, of at least one of the rigid substrate and the flexible substrate;

controlling the liquid-philicity adjustable layer to have a first liquid-philicity so that hydrophilic groups are formed at a surface of the liquid-philicity adjustable layer and bonding the flexible substrate to the rigid substrate;

forming a display element on a surface of the flexible substrate away from the rigid substrate; and controlling the liquid-philicity adjustable layer to have a second liquid-philicity so that hydrophobic groups are formed at the surface of the liquid-philicity adjustable layer and peeling off the flexible substrate from the rigid substrate, wherein the liquid-philicity adjustable layer comprises one or more adjustable layer units each comprising:

a first liquid-philicity adjustable layer;

a light-and-heat barrier layer; and a second liquid-philicity adjustable layer, wherein the light-and-heat barrier layer is between the first liquid-philicity adjustable layer and the second liquid-philicity adjustable layer.

9. The manufacturing method of claim 8, wherein the step of controlling the liquid-philicity adjustable layer to have the first liquid-philicity comprises:

causing the liquid-philicity adjustable layer to be at a first temperature so that the hydrophilic groups are formed at the surface of the liquid-philicity adjustable layer, and wherein the step of controlling the liquid-philicity adjustable layer to have the second liquid-philicity comprises:

causing the liquid-philicity adjustable layer to be at a second temperature so that the hydrophobic groups are formed at the surface of the liquid-philicity adjustable layer.

10. The manufacturing method of claim 8, wherein the step of controlling the liquid-philicity adjustable layer to have the first liquid-philicity comprises:

causing the liquid-philicity adjustable layer to be at a first pH value so that the hydrophilic groups are formed at the surface of the liquid-philicity adjustable layer, and wherein the step of controlling the liquid-philicity adjustable layer to have the second liquid-philicity comprises:

causing the liquid-philicity adjustable layer to at a second pH value so that the hydrophobic groups are formed at the surface of the liquid-philicity adjustable layer.

11. The manufacturing method of claim 8, wherein the step of controlling the liquid-philicity adjustable layer to have the first liquid-philicity comprises:

applying a voltage having a first electric field intensity to the liquid-philicity adjustable layer so that the hydrophilic groups are formed at the surface of the liquid-philicity adjustable layer, and wherein the step of controlling the liquid-philicity adjustable layer to have the second liquid-philicity comprises:

applying a voltage having a second electric field intensity to the liquid-philicity adjustable layer so that the hydrophobic groups are formed at the surface of the liquid-philicity adjustable layer.

12. The manufacturing method of claim 8, wherein the step of controlling the liquid-philicity adjustable layer to have the first liquid-philicity comprises:

irradiating the liquid-philicity adjustable layer with light having a first intensity so that the hydrophilic groups are formed at the surface of the liquid-philicity adjustable layer, and wherein the step of controlling the liquid-philicity adjustable layer to have the second liquid-philicity comprises:

irradiating the liquid-philicity adjustable layer with light having a second intensity so that the hydrophobic groups are formed at the surface of the liquid-philicity adjustable layer.

13. The manufacturing method of claim 8, wherein the step of controlling the liquid-philicity adjustable layer to have the first liquid-philicity comprises:

placing the liquid-philicity adjustable layer in a first reaction liquid so that the hydrophilic groups are formed at the surface of the liquid-philicity adjustable layer, and wherein the step of controlling the liquid-philicity adjustable layer to have the second liquid-philicity comprises:

placing the liquid-philicity adjustable layer in a second reaction liquid so that the hydrophobic groups are formed at the surface of the liquid-philicity adjustable layer.

* * * * *